(12) United States Patent
Kim

(10) Patent No.: US 9,739,835 B2
(45) Date of Patent: Aug. 22, 2017

(54) METHOD FOR ESTIMATING POWER OF FUEL CELL

(71) Applicant: Hyundai Motor Company, Seoul (KR)

(72) Inventor: Dae Jong Kim, Yongin-si (KR)

(73) Assignee: Hyundai Motor Company, Seoul (KR)

(*) Notice: Subject to any disclaimer, the term of this patent is extended or adjusted under 35 U.S.C. 154(b) by 217 days.

(21) Appl. No.: 14/862,581

(22) Filed: Sep. 23, 2015

(65) Prior Publication Data

US 2016/0238664 A1  Aug. 18, 2016

(30) Foreign Application Priority Data

Feb. 16, 2015  (KR) .................... 10-2015-0023105

(51) Int. Cl.
| | | |
|---|---|---|
| *G01N 27/416* | (2006.01) | |
| *G01N 27/02* | (2006.01) | |
| *G01R 31/36* | (2006.01) | |
| *H01M 8/04537* | (2016.01) | |
| *H01M 8/04302* | (2016.01) | |

(52) U.S. Cl.
CPC .... *G01R 31/3627* (2013.01); *H01M 8/04302* (2016.02); *H01M 8/04559* (2013.01); *H01M 8/04597* (2013.01); *H01M 8/04619* (2013.01); *G01R 31/3693* (2013.01); *H01M 2220/20* (2013.01)

(58) Field of Classification Search
CPC .............................................. H01M 8/04302
USPC ........................................................ 324/431
See application file for complete search history.

(56) References Cited

U.S. PATENT DOCUMENTS

| | | | |
|---|---|---|---|
| 2010/0112402 A1* | 5/2010 | Ogawa | H01M 8/04089 429/513 |
| 2016/0254554 A1* | 9/2016 | Hoshi | H01M 8/0662 429/431 |

FOREIGN PATENT DOCUMENTS

| | | |
|---|---|---|
| JP | 2004265683 | 9/2004 |
| JP | 2011222183 | 11/2011 |
| JP | 2013069485 | 4/2013 |
| JP | 2013-206625 | 10/2013 |
| KR | 10-2010-0034053 | 3/2010 |
| KR | 101439058 | 11/2014 |

OTHER PUBLICATIONS

Notice of Allowance issued in corresponding Korean patent application No. 10-2015-0023105, dated Feb. 15, 2016, pp. 1-2.

* cited by examiner

*Primary Examiner* — Edward Tso
*Assistant Examiner* — Ahmed Omar
(74) *Attorney, Agent, or Firm* — Brinks Gilson & Lione

(57) ABSTRACT

Disclosed herein is a method for estimating a power of a fuel cell. The method includes estimating a predictive current at a predetermined voltage in a controller, based on a present current-voltage characteristic of the fuel cell while the temperature of the fuel cell is being raised, estimating a first power, based on the estimated predictive current and the predetermined voltage, after the step of estimating the predictive current, estimating a second power based on a cell voltage rate while estimating the first power, and calculating an available power of the fuel cell, based on the first power and the second power, after the step of estimating the first power and the step of estimating the second power are performed.

8 Claims, 6 Drawing Sheets

METHOD FOR ESTIMATING POWER OF FUEL CELL

CROSS REFERENCE TO RELATED APPLICATION

The present application claims the benefit of priority to Korean Patent Application No. 10-2015-0023105, filed Feb. 16, 2015, the disclosure of which is incorporated herein by this reference.

BACKGROUND

1. Field

The present invention relates to a method for estimating a power of a fuel cell that estimates in real time an available power of the fuel cell to determine whether a cold start can be completed while the temperature of the fuel cell is being raised for the cold start.

2. Description of the Related Art

The statements in this section merely provide background information related to the present disclosure and may not constitute prior art.

When water inside a fuel cell freezes due to low temperature, a temperature-raising process is required to secure power of the fuel cell.

FIG. 1 is a graph illustrating a variation in a performance output of a fuel cell while the temperature of the fuel cell is raised according to a conventional art. Referring to FIG. 1, at the beginning of the temperature-raising process, the fuel cell stack in a low temperature state outputs the performance represented as the points on line ①. While the temperature-raising process is in progress, the stack voltage gradually increases at a nearly constant current as in line ②. Then, when the temperature-raising process is completed, the performance is represented as the points on line ③. In other words, as the fuel cell having the stack performance represented as line ① cannot output a power required to drive a vehicle, the temperature-raising process progresses until the fuel cell has the stack performance represented as line ③.

However, the power of the fuel cell during the temperature-raising process is low compared to the power required to drive a vehicle. That is because the performance of the stack decreases below the voltage conditions necessary for normal operation of high-voltage components when a current for driving the vehicle is applied.

In other words, it is unnecessary to continue the temperature-raising operation until the power of the fuel cell reaches the power required to drive the vehicle. However, as the technique for ascertaining the degree of temperature-increase or an available power of the fuel cell during the temperature-raising operation is insufficient, starting of the ignition may be excessively delayed until the temperature is sufficiently raised.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problem, and an object of the present disclosure is to provide a method for estimating a power of a fuel cell to minimize an ignition starting delay, which may enable completion of a cold start at suitable time by estimating an available power of the fuel cell based on a current-voltage characteristic and a cell voltage rate while the temperature of the fuel cell is being raised for the cold start.

To achieve the above object, a method for estimating a power of a fuel cell according to the present invention may include: estimating a predictive current at a predetermined voltage in a controller, based on a present current-voltage characteristic of a fuel cell while a temperature of the fuel cell is being raised; estimating a first power, based on the estimated predictive current and the predetermined voltage, after estimating the predictive current; estimating a second power based on a cell voltage rate while estimating the first power; and calculating an available power of the fuel cell, based on the first power and the second power, after estimating the first power and estimating the second power are performed.

Determining whether an engine start is a cold start is further included before estimating the predictive current, and when it is determined that the engine start is a cold start, estimating the predictive current may be performed after a temperature-raising operation of the fuel cell is performed.

The predetermined voltage is a reference voltage capable of operating high-voltage components of a vehicle.

The predictive current is estimated based on a current-voltage gradient that is predetermined by the present current-voltage characteristic of the fuel cell while the temperature of the fuel cell is being raised.

The cell voltage rate is a ratio of a lowest voltage of multiple cells to an average voltage of the multiple cells, and increases with an increase in a voltage of a cell outputting the lowest voltage.

The second power increases with an increase in the cell voltage rate.

The second power is estimated as a positive value at the cell voltage rate equal to or greater than a first reference value, as 0 at the cell voltage rate equal to or greater than a second reference value and less than the first reference value, and as a negative value at the cell voltage rate less than the second reference value.

The available power of the fuel cell is a sum of the first power and the second power.

According to the method for estimating a power of a fuel cell configured as the above description, as an available power of the fuel cell is estimated, starting of an ignition may be completed at suitable time, whereby an ignition starting delay may be minimized.

Also, as an available power of the fuel cell is estimated by considering a cell voltage rate as well as a current-voltage characteristic while the temperature of the fuel cell is being raised, the available power of the fuel cell may be precisely estimated so as to calculate the time when starting of the ignition is completed.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

DETAILED DESCRIPTION

Figure 1:
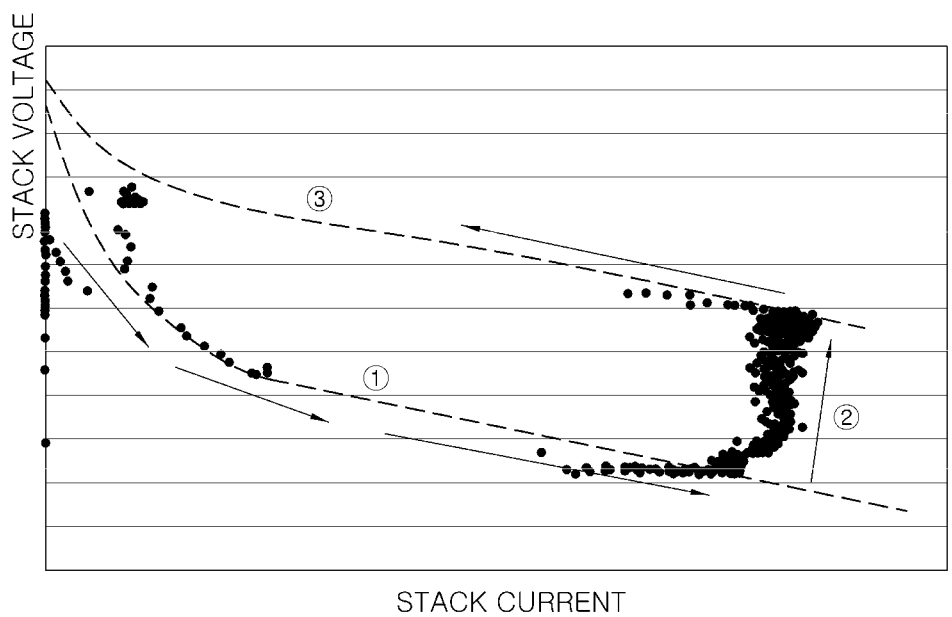
FIG. 1 is a graph illustrating a variation in a performance output of a fuel cell while the temperature of the fuel cell is being raised according to a conventional art.
Figure 2:
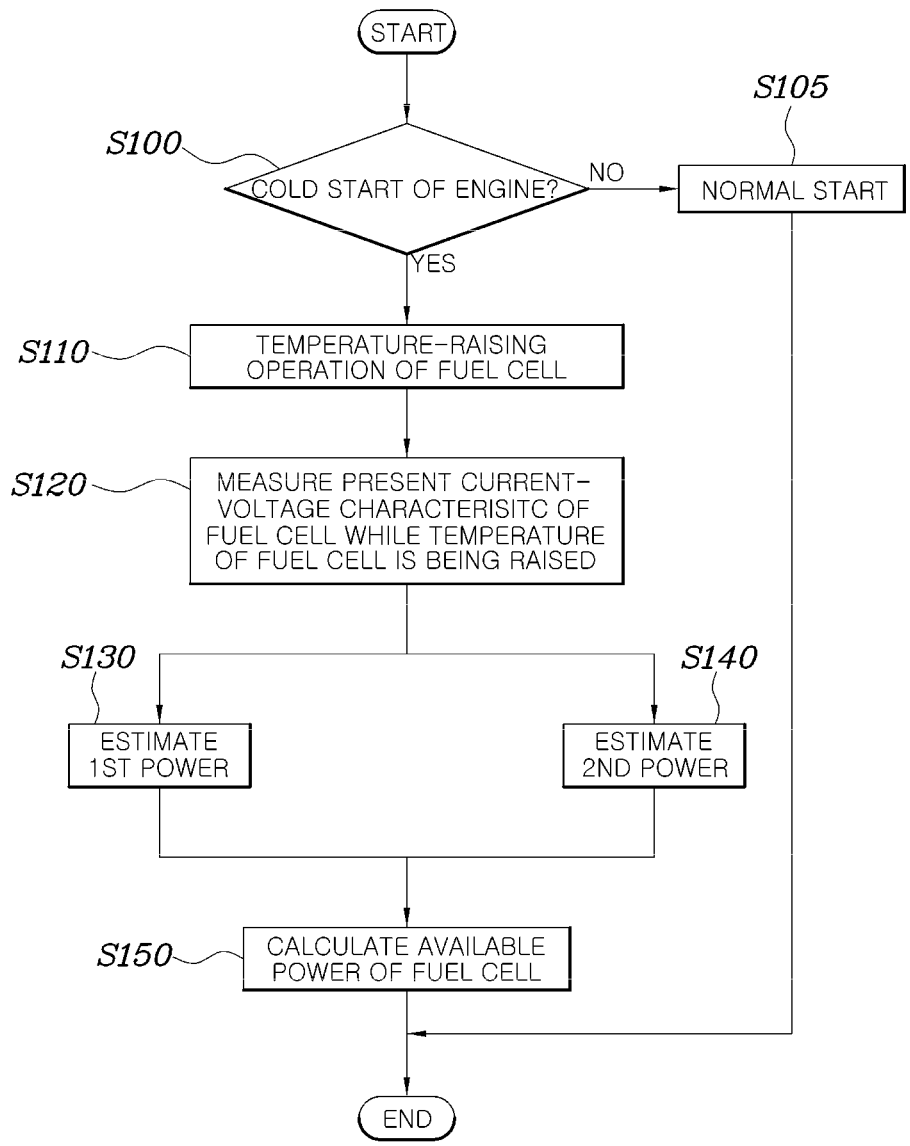
FIG. 2 is a flow diagram for illustrating a method for estimating a power of a fuel cell.
Figure 3:
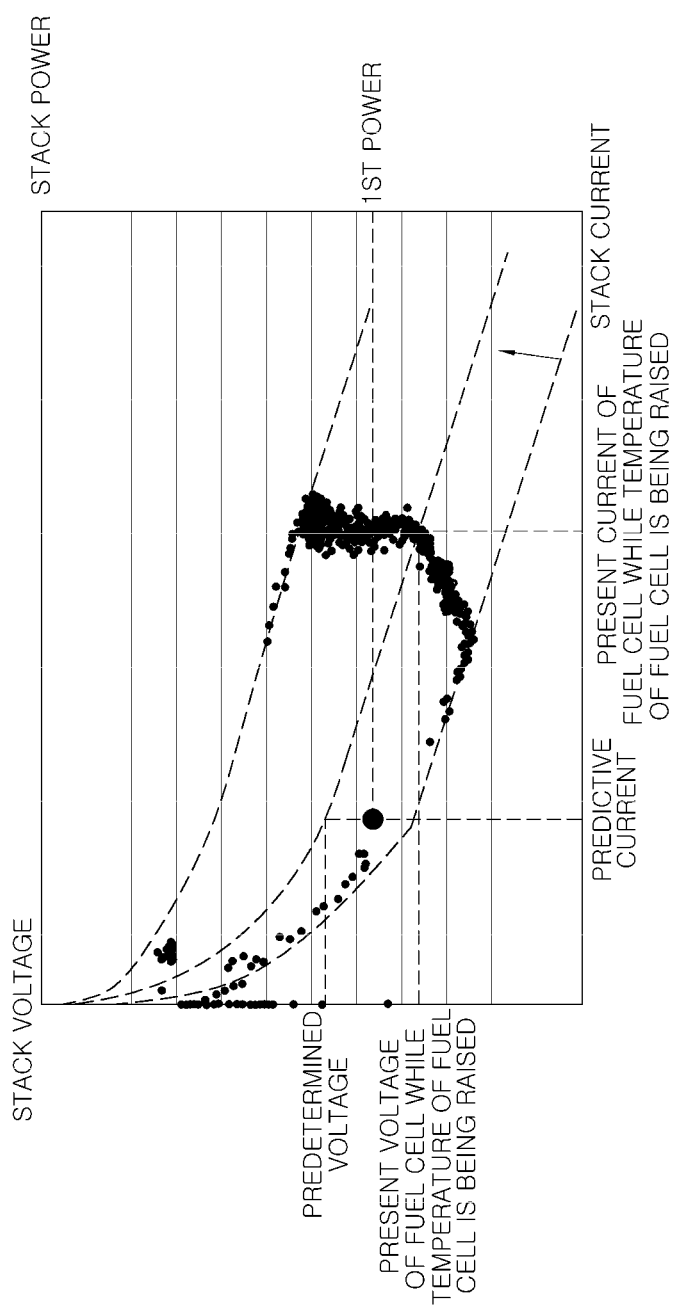
FIGS. 3 to 4 are graphs for illustrating a method for estimating a first power in a method for estimating a power of a fuel cell.
Figure 4:
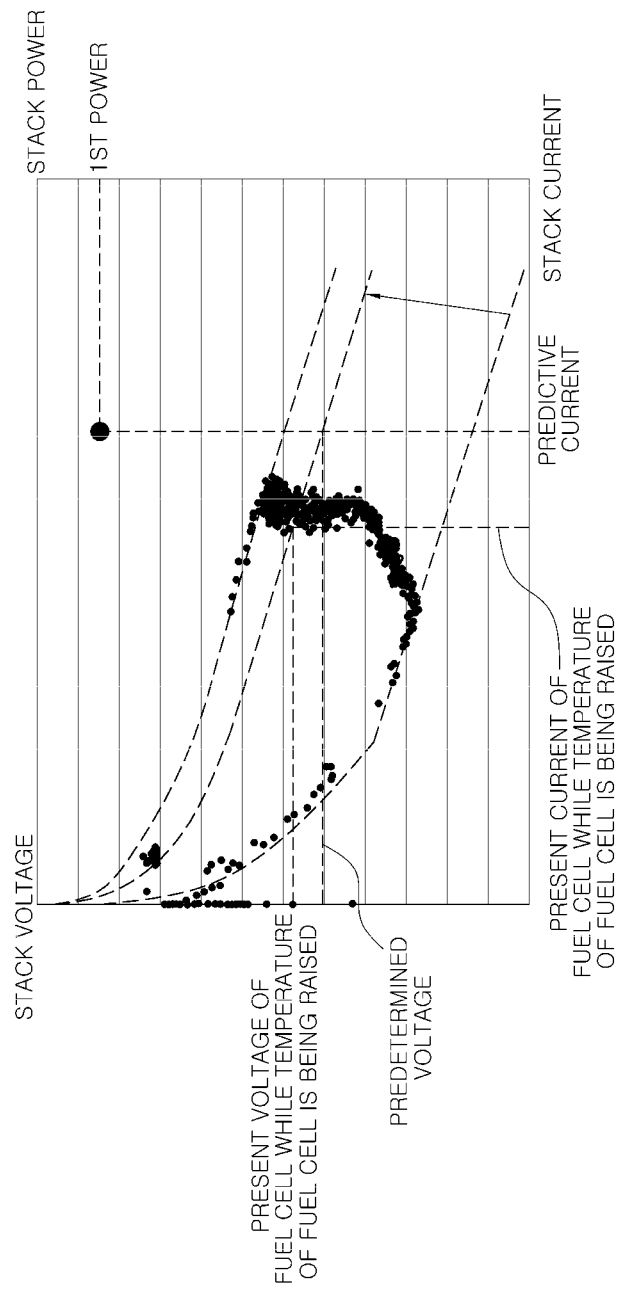
Figure 5:
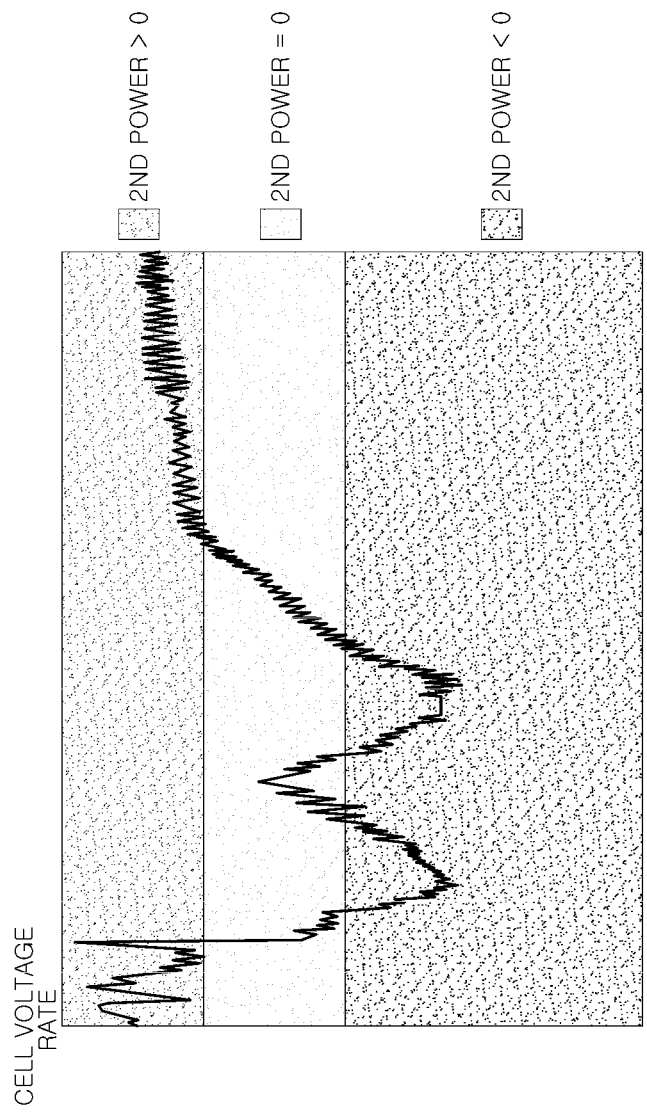
FIG. 5 is a graph for illustrating a method for estimating a second power in a method for estimating a power of a fuel cell.

Hereinafter, a method for estimating a power of a fuel cell according to an embodiment of the present disclosure is described referring to the accompanying drawings. FIG. 2 is a flow diagram for illustrating a method for estimating a power of a fuel cell according to an embodiment of the present disclosure; FIGS. 3 to 4 are graphs for illustrating a method for estimating a first power in a method for estimating a power of a fuel cell according to an embodiment of the present disclosure; FIG. 5 is a graph for illustrating a method for estimating a second power in a method for estimating a power of a fuel cell according to an embodiment of the present disclosure; and FIG. 6 is a block diagram for illustrating an apparatus for estimating a power of a fuel cell according to an embodiment of the present disclosure.

Referring to FIGS. 2 to 6, a method for estimating a power of a fuel cell may include: estimating a predictive current at a predetermined voltage in a controller based on a present current-voltage characteristic while the temperature of the fuel cell is being raised (S120); estimating a first power based on the estimated predictive current and the predetermined voltage after estimating the predictive current S120 (S130); estimating a second power based on a cell voltage rate while estimating the first power at S130 (S140); and calculating an available power of the fuel cell based on the first power and the second power after estimating the first power S130 and estimating the second power S140 are performed (S150). In this case, the predetermined voltage is a reference voltage capable of operating high-voltage components of a vehicle, and the predictive current is estimated based on a current-voltage gradient that is predetermined by the present current-voltage characteristic of the fuel cell while the temperature of the fuel cell is being raised.

Figure 6:
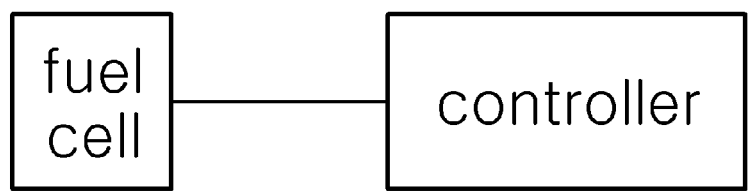
FIG. 6 is a block diagram for illustrating an apparatus for estimating a power of a fuel cell.

Herein, as shown in FIG. 6, the controller is connected with the fuel cell to sense the present current-voltage characteristic of a fuel cell while a temperature of the fuel cell is being raised, thereby the predictive current, the first power, the second power and the available power of the fuel cell in the predetermined voltage being estimated.

First, before estimating the predictive current (S120) by the controller, determining whether an engine start is a cold start (S100) is performed. When it is determined in S100 that the engine start is a cold start, estimating the predictive current (S120) may be performed after a temperature-raising operation of the fuel cell (S110) is performed.

At S100, whether the engine start is a cold start is determined by the temperature of coolant which is sensed through a temperature sensor by the controller. When the temperature of the coolant is a predetermined temperature or below, as the engine is determined to be under a cold start condition, the temperature-raising operation, in which hydrogen and air are supplied to the fuel cell, is performed (S110). On the other hand, when the temperature of the coolant is above the predetermined temperature, as it is determined not to be under a cold start condition, a normal start operation is performed (S105).

According to a conventional art, performance of a fuel cell is changed depending on the temperature-raising process when a cold start is attempted. At the beginning of the start of an ignition, a voltage to a current ratio is output low. After that, the characteristic of the fuel cell is changed to output a high voltage at a certain current, and the voltage to the current ratio is output high at the completion of the temperature-raising process.

Referring to FIG. 3, when the engine is under a cold start condition, a variation in a power of the fuel cell stack according to the temperature-raising process is checked by the controller. A lowermost line indicates the performance of the fuel cell stack at the beginning of the starting of the ignition, and an uppermost line indicates the performance of the fuel cell stack at the end of the temperature-raising process. There is a difference of an absolute voltage level between the two lines, but the lines are similar in terms of the voltage gradient that changes with the increase or decrease of the voltage. The present invention sets the gradient as a predetermined current-voltage gradient.

Consequently, the present invention may estimate the performance curve, represented by the line in the center of FIG. 3, by applying the current-voltage gradient predetermined by the present current and voltage while the temperature of the fuel cell is being raised. In this case, the predictive current, which may output the predetermined voltage according to the present performance of the fuel cell, may be estimated by the performance curve. The first power of the available power of the fuel cell that is performing the temperature-raising operation may be estimated by multiplying the estimated predictive current by the predetermined voltage.

FIG. 4 shows a variation in a power of the fuel cell of which the temperature-raising operation is performed longer than the embodiment of FIG. 3. In the performance curve of the fuel cell illustrated in the center of FIG. 4, the voltage to the current ratio is higher compared to FIG. 3. Also, because the predictive current estimated from the predetermined voltage is higher, the fuel cell stack may output the predetermined voltage corresponding to the predictive current.

Additionally, the present invention may improve the precision of the available power of the fuel cell by estimating the second power based on the cell voltage rate. Here, the cell voltage rate is a ratio of the lowest voltage of multiple cells to the average voltage of the multiple cells, and the cell voltage rate becomes higher as the voltage of a cell outputting the lowest voltage increases. Also, the second power increases as the cell voltage rate is higher.

In other words, when the fuel cell is in a frozen state at the beginning of the temperature-raising process, there may be a cell having relatively high performance and a cell having relatively low performance due to uneven freezing. As the temperature-raising process is in progress, high heat is produced in the cell having the low performance and the performance of the cell is steadily restored to normal. At the end of the temperature-raising process, the cell voltage rate has a value near 1.

Referring to FIG. 5, when the cell voltage rate is equal to or greater than a first reference value, the second power is estimated as a positive value; when the cell voltage rate is equal to or greater than a second reference value and less than the first reference value, the second power is estimated as zero (0); and when the cell voltage rate is less than the second reference value, the second power is estimated as a negative value. As the practically estimated first power is increased or decreased according to the cell voltage rate, the precision of the first power may be decreased.

The available power of the fuel cell may be calculated by adding the first power and the second power by the controller. In conclusion, the available power may be precisely estimated by adding the second power by the controller, which is obtained by considering the cell voltage uniformity from the cell voltage rate, to the first power, which is estimated by the current-voltage characteristic of the fuel cell while the temperature of the fuel cell is being raised.

According to the method for estimating a power of the fuel cell, configured as the above description, it is possible to estimate the available power of the fuel cell, whereby starting of the ignition may be completed at suitable time and an unnecessary delay may be minimized.

Also, in estimating the available power of the fuel cell, as a cell voltage rate as well as the current-voltage characteristic is considered, the available power of the fuel cell may be more precisely estimated, whereby it is possible to calculate suitable completion time.

The description of this disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for estimating a power of a fuel cell, comprising:
    estimating a predictive current at a predetermined voltage in a controller, based on a present current-voltage characteristic of a fuel cell while a temperature of the fuel cell is being raised;
    estimating a first power, based on the estimated predictive current and the predetermined voltage, after the step of estimating the predictive current;
    estimating a second power based on a cell voltage rate while estimating the first power; and
    calculating an available power of the fuel cell, based on the first power and the second power, after the step of estimating the first power and the step of estimating the second power are performed.

2. The method of claim 1, further comprising:
    determining whether an engine start is a cold start before the step of estimating the predictive current,
    wherein when it is determined that the engine start is the cold start, the step of estimating the predictive current is performed after a temperature-raising operation of the fuel cell is performed.

3. The method of claim 1, wherein the predetermined voltage is a reference voltage capable of operating high-voltage components of a vehicle.

4. The method of claim 1, wherein the predictive current is estimated based on a current-voltage gradient that is predetermined by the present current-voltage characteristic of the fuel cell while the temperature of the fuel cell is being raised.

5. The method of claim 1, wherein the cell voltage rate is a ratio of a lowest voltage of multiple cells to an average voltage of the multiple cells, and increases with an increase in a voltage of a cell outputting the lowest voltage.

6. The method of claim 5, wherein the second power increases with an increase in the cell voltage rate.

7. The method of claim 5, wherein the second power is estimated as a positive value when the cell voltage rate is equal to or greater than a first reference value, as zero when the cell voltage rate is equal to or greater than a second reference value and less than the first reference value, and as a negative value when the cell voltage rate is less than the second reference value.

8. The method of claim 1, wherein the available power of the fuel cell is a sum of the first power and the second power.

* * * * *